May 16, 1961
S. L. MATLOW ET AL
RUGGEDIZED SOLAR CELL AND PROCESS FOR MAKING THE SAME OR THE LIKE
Filed July 9, 1958
2,984,775
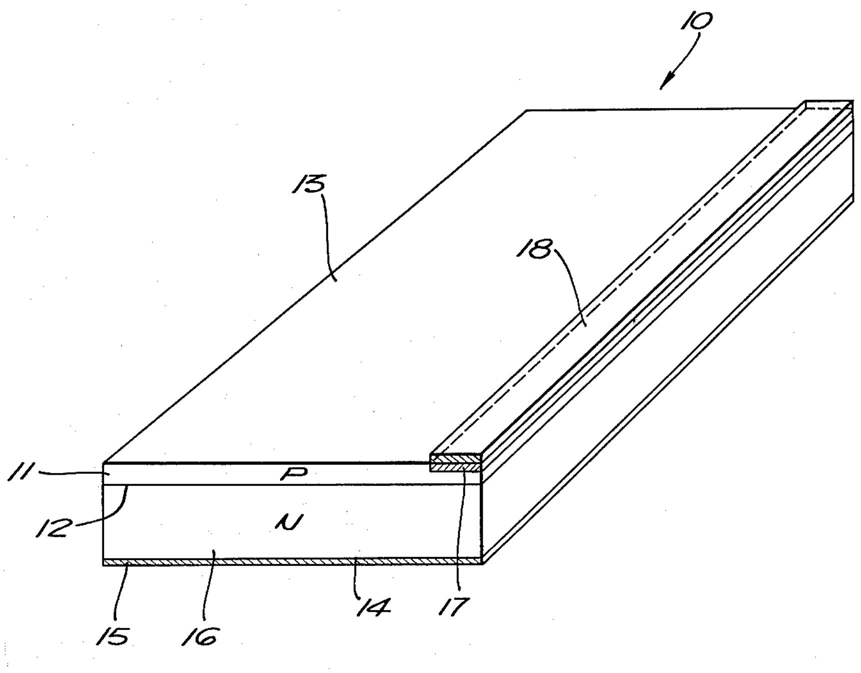
SHELDON L. MATLOW
EUGENE L. RALPH
INVENTORS
BY [signature]
ATTORNEY

United States Patent Office 2,984,775
Patented May 16, 1961

2,984,775

RUGGEDIZED SOLAR CELL AND PROCESS FOR MAKING THE SAME OR THE LIKE

Sheldon L. Matlow, Chicago, and Eugene L. Ralph, Skokie, Ill., assignors to Hoffman Electronics Corporation, a corporation of California Filed July 9, 1958, Ser. No. 747,397

10 Claims. (Cl. 317—240)

This invention relates to improvements in semiconductor devices and, more particularly, to a method for providing an ohmic contact on a semiconductor, such ohmic contact exhibiting the ability to withstand relatively high operating temperatures.

One of the problems in fabricating practical semiconductor devices is that of providing electrical contacts to the N and P portions of the semiconductor element with materials that will withstand relatively high temperatures. The silicon solar energy converter, more commonly referred to as the solar cell, is one example of a semiconductor device the ohmic contacts to which should, for maximum practical usage, withstand high temperatures without melting. This becomes particularly important when the solar cells are incorporated in space vehicles which must, necessarily, go through relatively high temperature conditions during launching of the space vehicle. The solar cells of the prior art have used a contact to both the N and P portions comprising a very thin plated layer of nickel with a heavy coating of low-melting point solder deposited thereon by means of a dipping process. In utilizing multiple solar cells it has been the practice to overlay the cells as described in copending application Serial No. 595,630, filed July 3, 1956 in the name of Donald C. Dickson, Jr., raising the temperature of the cells to the melting point of the solder and then permitting the combination to cool. While this makes for convenient assembly of the cells, the assembly is subject to impairment of performance if, during the launching of a spaced vehicle, for example, the temperature of the cells rises above the melting point of the solder. Open circuiting of the cell combination may result.

It is desirable, therefore, to utilize for the contact material something which exhibits a melting point above that of conventional solders but at the same time something which can be melted at a temperature below that which would destroy the characteristics of the P-N junction in a semiconductor. At the same time, the material which is used must be so treated in the process of applying it to the semiconductor base material that a rectifying junction does not occur at the interface between that portion of the base semiconductor material into which the contact material has been introduced, as by alloying, and the remainder of the base semiconductor material.

Therefore, it is an object of this invention to provide a semiconductor device having contacts which will withstand relatively high temperatures while, at the same time, those contacts will melt at temperatures below those which will destroy the rectifying P-N junction in the associated semiconductor device.

It is a further object of this invention to provide a process for applying to a semiconductor device a contact which will exhibit a relatively high melting point but at the same time will not produce a rectifying junction between the portion of the semiconductor base material into which the contact material is alloyed and the contiguous semiconductor base material.

According to the present invention one or more aluminum contacts are evaporated onto the P and N portions of a semiconductor and the combination is then subjected to a rapid temperature cycle which takes the combination above the melting point of aluminum and then drops below the eutectic point of the aluminum-semiconductor metal alloy where the combination is held for a short period to permit annealing of the semiconductor material. The temperature is then returned to room ambient. As a result of the temperature cycling, an orderly crystalline regrowth layer is prevented which is desirable in order to prevent the production of a rectifying junction between the alumium contact material and the N-type base semiconductor material.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which The sole figure is a perspective drawing of a semiconductor having contacts applied according to the present invention with certain regions shown with exaggerated dimensions.

In the sole figure, base material 10 is a wafer of semiconductor material, for example a slice from a single crystal of silicon. In this example the silicon base material has been doped with a material such as arsenic having the electron donor characteristics so as to make the base material of wafer 10 of the N-type. An acceptor material has been diffused into the upper layer 11 of wafer 10 to give that layer a P characteristic. Line 12 represents the P-N junction which gives wafer 10 desired rectifying characteristics. The method for diffusing the acceptor material into region 11 is well known and described in such patents as 2,834,696 issued to Calvin S. Fuller. This process involves exposing a wafer of N-type silicon, for example, to an atmosphere of boron trichloride or boron trifluoride in an oven operating at approximately 1100° C. An inert gas such as helium may also be introduced to reduce oxidization of the slice during the diffusion process. The gaseous boron compound decomposes at the high temperature and leaves elemental boron which diffuses into the surface of the silicon. The wafer is then masked on all surfaces except which it is intended should maintain its P characteristics and the wafer is etched in acid solutions to remove the P-layer from all except the desired surface of the wafer. The etched wafers are then cleaned in a degreasing solution such as potassium hydroxide.

Upper surface 13 exhibiting P characteristics is then masked except in a region where it is desired that a contact be applied and a thin strip of aluminum is evaporated onto the exposed portion of upper surface 13 by the well known vacuum evaporation process. The same process is used to evaporate aluminum on surface 14, which is the surface of the N-type layer of wafer 10. Surface 13 and region 15 are then masked and the exposed edges of the cells of the wafer are etched to clean up the junction region.

The wafer is now ready for the alloying steps in the process. The wafer, with the masks removed, is placed in an oven in which an inert atmosphere such as one of dry nitrogen or a vacuum is maintained. The wafer is then heated gradually to a temperature of about 500° C., which is below the eutectic point (577° C.), for a combination of aluminum and silicon. The temperature of the wafer is then increased to approximately 700° C., which is above the melting point of aluminum. This temperature increase is a rapid one, occurring in about two minutes, giving a temperature rise rate of about 100° C. per minute. The temperature is held at approximately 700° C. for 15 to 30 seconds and is then reduced to 500° C. in from 30 seconds to one minute. The temperature is held at 500° C. for about five minutes to anneal the cells. The furnace is then turned off and the wafer cools gradually to room ambient temperature. This cooling process takes about 15 minutes, althrough that time is not critical.

The equation for the conditions which exist during the foregoing process may be written as follows, provided the composition of the liquid phase is close to that of liquidus line composition at the given temperature:

$$Si_{(s)} \xrightarrow{1} Si_{(L)} \underset{}{\overset{2}{\rightleftarrows}} Si_{(\beta)}$$

where $Si_{(s)}$ is the pure silicon in a solid state, $Si_{(L)}$ is silicon dissolved in the liquid aluminum, and $Si_{(\beta)}$ is solid $\beta$-phase silicon with aluminum doping. If the temperature rises fast enough, reaction 1 will occur much faster than reaction 2.

When the system is cooled rapidly, as described, to a temperature below the aluminum-silicon eutectic temperature of 577° C., the resulting solid is a mixture of alpha and beta phase silicon in a disorderly array. This disorderly crystalline regrowth condition is not conducive to the production of a rectifying P-N junction, and results in a contact having good ohmic characteristics.

Because of the difficulty that is sometimes encountered in adequately controlling the temperatures involved in this process some orderly crystalline regrowth may occur on region 15 contiguous with surface 14. The deleterious effects of such regrowth can be prevented by making region 15 degenerate, that is by introducing a relatively large amount of an element having electron donor characteristics. Thus, phosphorus or antimony may be diffused through surface 14 into region 15 before the aluminum contact is evaporated onto surface 14. Alternatively, the doping agent may be added to the aluminum evaporation charge and introduced at the time the contact is evaporated on surface 14. In either case, any tendency to create a P-N junction between region 15 and the remaining N portion 16 of wafer 10 will be overcome.

It is apparent that regions 15 and 17, which represent those regions in which the aluminum has alloyed into the silicon have been idealized as to their configurations in the sole figure. The bases of the alloying regions may not in practice be absolutely parallel to each other and to the faces of the wafer 10.

Where wafer 10 constitutes a silicon solar cell and if it is desired to bond several such cells in series electrical connection, as described in copending application Serial No. 595,630, a clean aluminum wire is placed along contact 18 and the surface 14 of the next cell is placed in an overlying relationship with respect to such aluminum wire, all before the heat cycling process has begun. The aluminum wire provides sufficient aluminum to effect a good electrical and mechanical bond between the series-connected cells. Series cells so connected can withstand temperatures in the order of 500° C. without separating.

Thus, there has been provided by this invention a semiconductor device having contacts which will withstand relatively high temperatures and a process for obtaining such a semiconductor device.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

We claim:

1. A silicon semiconductor device including a portion having an N-type impurity, and an ohmic contact to said portion having as a major constituent aluminum.

2. A semiconductor device including a portion having an impurity therein of a first type, and an ohmic contact to said portion having as a major constituent a material having an impurity characteristic of the opposite type.

3. A semiconductor device including a region of N-type material, a contiguous region of P-type material, and a contact to said region of N-type material having as a major constituent aluminum alloyed with said N-type material to form a disorderly crystalline regrowth portion having ohmic characteristics.

4. A device according to claim 1 in which said semiconductor device is of the silicon type.

5. The process of producing a temperature resistant, non-rectifying contact to an N-type semiconductor material which includes the steps of evaporating aluminum on a desired portion of the exposed face of said N-type material; raising the temperature of said material at a relatively slow rate to a first point approaching the eutectic temperature of an alloy of aluminum and said semiconductor material; raising the temperature of said material at a first rapid rate to a second point above the melting temperature of aluminum but below its vaporization temperature; and dropping the temperature of said material at a second rapid rate to a third point in the order of 100° C. below the eutectic temperature of an alloy of aluminum and said semiconductor material.

6. The process of producing a temperature resistant, non-rectifying contact to an N-type semiconductor material which includes the steps of evaporating aluminum on a desired portion of the exposed face of said N-type material; raising the temperature of said material to a first point in the order of 100° C. below the eutectic temperature of an alloy of aluminum and said semiconductor material; raising the temperature of said material at a first rapid rate to a second point above the melting temperature of aluminum but below its vaporization temperature; dropping the temperature of said material at a second rapid rate to a third point in the order of 100° C. below the eutectic temperature of an alloy of aluminum and said semiconductor material; and annealing said semiconductor material at said third point.

7. A process according to claim 5 in which said semiconductor material is silicon, said first point is 500° C., said second point is 700° C. and said third point is 500° C.

8. A process according to claim 5 in which said first point is approximately 500° C., said first rapid rate is approximately 100° C. per minute, said second point is approximately 700° C. and said second rate is approximately 200° C. per minute.

9. A semiconductor device including a first region having a dominantly electron donor impurity so as to be of the N type, a second region having a dominantly electron acceptor impurity so as to be of the P type and being adjacent to said first region, and aluminum ohmic contacts alloyed to said first and second regions, respectively.

10. A semiconductor device including an N region and a P region, a first ohmic contact to said P region, a second ohmic contact to said N region, said second ohmic contact having as a major constituent aluminum alloyed with the material of said N region.

References Cited in the file of this patent

UNITED STATES PATENTS

| | | |
|---|---|---|
| 2,763,822 | Frola et al. | Sept. 18, 1956 |
| 2,805,370 | Wilson | Sept. 3, 1957 |
| 2,858,246 | Pearson | Oct. 28, 1958 |